(12) United States Patent
Chuang et al.

(10) Patent No.: US 7,462,546 B2
(45) Date of Patent: Dec. 9, 2008

(54) COLLECTOR TAILORED STRUCTURES FOR INTEGRATION OF BINARY JUNCTION TRANSISTORS

(75) Inventors: Ming-Yeh Chuang, McKinney, TX (US); Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 471 days.

(21) Appl. No.: 11/406,788

(22) Filed: Apr. 19, 2006

(65) Prior Publication Data
US 2007/0249135 A1    Oct. 25, 2007

(51) Int. Cl.
H01L 21/331    (2006.01)
H01L 21/8222    (2006.01)

(52) U.S. Cl. ............... 438/309; 438/370; 257/E21.608
(58) Field of Classification Search ................ 438/309, 438/313, 370, 371; 257/E21.608
See application file for complete search history.

(56) References Cited

U.S. PATENT DOCUMENTS 6,365,913 B1    4/2002    Misewich et al.
6,376,897 B2    4/2002    Yamada et al.
6,716,709 B1    4/2004    Springer et al.
6,815,276 B2    11/2004   Hower et al.
6,869,851 B2    3/2005    Trogolo et al.
6,878,999 B2    4/2005    Hower et al.
6,900,101 B2    5/2005    Lin
6,964,907 B1    11/2005   Hopper et al.
7,164,174 B2 *  1/2007    Springer ................. 257/370

* cited by examiner

Primary Examiner—Hoai v Pham
(74) Attorney, Agent, or Firm—Wade J. Brady, III; Frederick J. Telecky, Jr.

(57) ABSTRACT

A bipolar transistor is formed in an integrated BiCMOS process. A buried layer is formed in a semiconductor body. An intrinsic dilute mask is formed over the buried layer that covers at least a portion of a selected region of a target deep well region. The intrinsic dilute mask is employed to implant a dopant into the target deep well region to form a deep well region with the selected region having a lowered dopant concentration. The lowered dopant concentration can yield a higher breakdown voltage for the bipolar device. The intrinsic dilute mask mitigates implantation within the selected region.

24 Claims, 9 Drawing Sheets

100

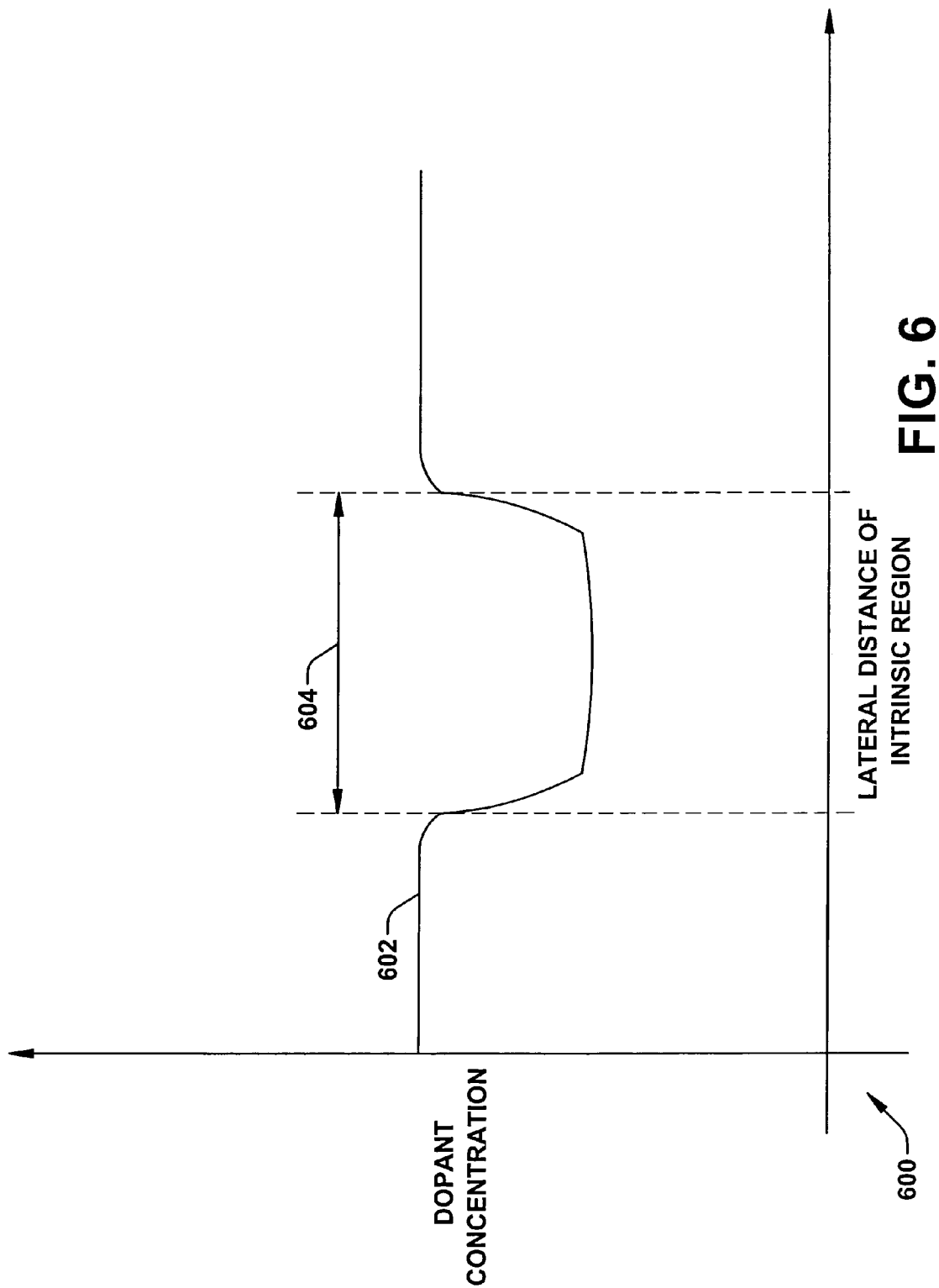

COLLECTOR TAILORED STRUCTURES FOR INTEGRATION OF BINARY JUNCTION TRANSISTORS

FIELD OF INVENTION

The present invention relates generally to semiconductor devices and more particularly relates to methods of adjusting dopant profiles within the intrinsic region to tailor device characteristics.

BACKGROUND OF THE INVENTION

Complementary metal oxide semiconductor (CMOS) is an integrated circuit technology offering low power consumption, ease of circuit design, and increasingly high performance with device scaling. Bipolar complementary metal oxide semiconductor (BiCMOS) is an integrated circuit technology that combines bipolar devices with CMOS to yield integrated circuit devices that can have reduced noise, improved linearity, device matching, and high drive capacity, and permit improved performance. BiCMOS integrated circuits have bipolar and MOS transistors formed on the same semiconductor body or substrate. One significant advantage of such devices is that they combine the high power and fast switching speeds of bipolar devices with the high density and low power consumption of MOS transistors. The diversity of uses for such BiCMOS devices has fueled a surge toward fabricating faster, denser and more powerful integrated BiCMOS devices by more individual device enhancing manufacturing processes.

When forming devices using a BiCMOS manufacturing process, care is taken to mitigate the number of masks employed therein to lower the manufacturing costs. Therefore efforts are made as often as is practicable to integrate the use of regions typically utilized for CMOS devices as regions in a bipolar device, and vice-versa. While such integration does serve to minimize manufacturing costs, in some cases the integration causes performance tradeoffs to be made.

One problem that can result from this integration is forming BiCMOS devices without tailoring specific characteristics, such as breakdown voltage due to the integration. The integration can, for example, prevent adjustment of dopant concentrations for various regions of the devices. As a result, the devices are formed with operational and/or performance characteristics that cannot be tailored.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate BiCMOS device fabrication by permitting the tailoring of bipolar device operational parameters without employing additional implantation and/or other processing. An intrinsic dilute mask is employed for forming a deep well region that yields varied regions of dopant concentration without employing varied implants. The intrinsic dilute mask includes at least a blocking portion that can reduce dopant concentration within an impact ionization region and, therefore increase breakdown voltage. Additionally, the mask can include a non-blocking portion, typically within the blocking portion, that permits higher dopant concentrations, for example, to facilitate drive current and/or device speed.

In accordance with one aspect of the invention, a method of fabricating a bipolar transistor in an integrated BiCMOS process is provided. A buried layer is formed in a semiconductor body. An intrinsic dilute mask is formed over the buried layer that covers at least a portion of a selected region of a target deep well region. The intrinsic dilute mask is employed to implant a dopant into the target deep well region to form a deep well region with the selected region having a lowered dopant concentration. The intrinsic dilute mask mitigates implantation within the selected region. Other aspects of the invention are disclosed.

Aspects of the present invention facilitate BiCMOS fabrication by tailoring dopant concentration profiles within intrinsic regions of bipolar transistors. An intrinsic dilute pattern is employed to selectively reduce dopant concentration within a selected portion of deep well regions. As a result, the dopant profile of the deep well regions can be adjusted to yield BiCMOS devices with tailored operational and/or performance characteristics.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 6 is a graph depicting dopant concentration throughout an intrinsic portion of a deep well region for a bipolar device formed in accordance with the present invention.

DETAILED DESCRIPTION OF THE INVENTION

Figure 1:
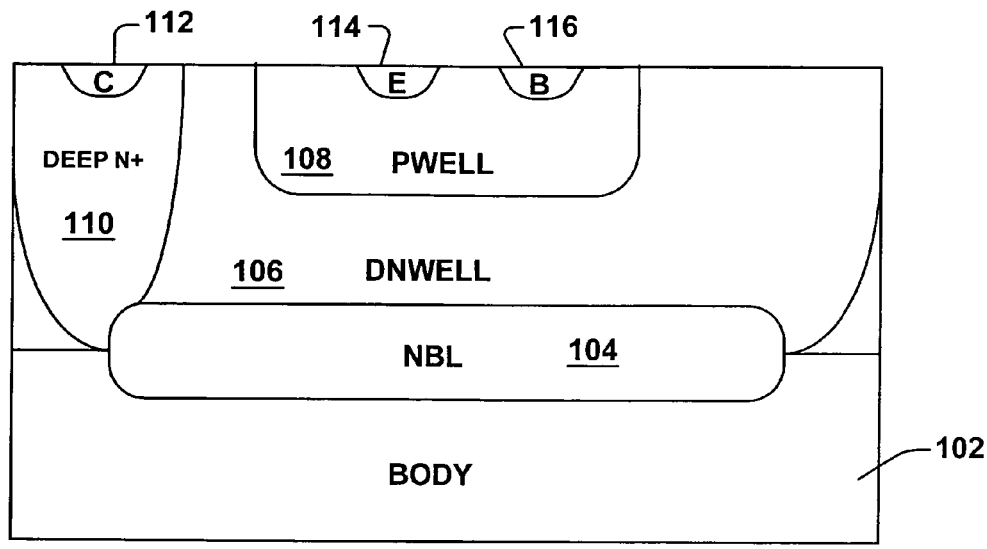
FIG. 1 is a cross sectional view of an example bipolar transistor device fabricated within a BiCMOS fabrication process.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

Aspects of the present invention facilitate BiCMOS fabrication by tailoring dopant profiles within regions of bipolar devices. An intrinsic dilute mask is employed to selectively alter the dopant profile of selected portions of deep well regions without employing separate implant processes and/or masks. As a result, performance and/or operational characteristics can be tailored. In one example, the intrinsic dilute mask includes at least a blocking portion that can reduce dopant concentration within an impact ionization region and, therefore increase breakdown voltage. Additionally, the intrinsic dilute mask can include varied portions, such as a non-blocking portion, typically within the blocking portion, that permits higher dopant concentrations, for example, to facilitate drive current and/or device speed.

FIG. 1 is a cross sectional view of an example bipolar transistor device 100 fabricated within a BiCMOS fabrication process. The device 100 is provided for illustrative purposes.

The bipolar device 100 is comprised of an n-type buried layer 104 formed in a semiconductor body or semiconductor substrate 102. A deep nwell 106 is formed on the n-type buried layer 104. Typically, the deep nwell 106 is formed by growing an epitaxial layer on/over the n-type buried layer 104 and then implanting an n-type dopant to form the deep nwell 106. A shallow pwell 108 is formed within the deep nwell 106 and a deep collector 110 is also formed within the deep nwell 106. The deep collector 110 is n-type and is in contact with the n-type buried layer 104. A collector region 112 is formed within the deep collector 110. An emitter region 114 and a base region 116 are formed within the shallow pwell 108. The deep collector region 110 is also referred to as an extrinsic portion of the deep nwell 106 whereas a remaining portion of the deep nwell 106 is referred to an intrinsic portion.

The bipolar device 100 has a number of operational characteristics, such as breakdown voltage (collector-emitter), gain, collector drive current, speed, and the like. The operational characteristics are at least partly a function of the dopant concentrations and/or profiles of the various regions of the device. For example, reducing the dopant concentration of the intrinsic region of the deep nwell region 106 can result in an increase in breakdown voltage (collector emitter). However, the reduced dopant concentration also reduces gain, drive current, and speed of the bipolar device 100.

Figure 2:
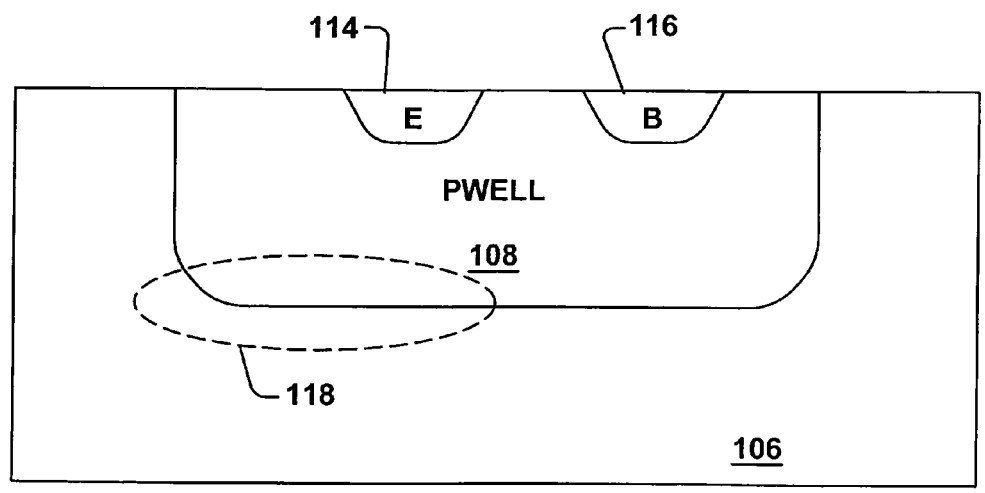
FIG. 2, a close up cross sectional view of a portion of the bipolar transistor device is provided.

Turning now to FIG. 2, a close up cross sectional view of a portion of the bipolar transistor device 100 is provided. This view is provided as an example in order to facilitate understanding of the present invention.

A non-destructive breakdown occurs during active operation of the device 100 resulting in emitter-collector current. During the active operation, a large electric field in a base-collector depletion region causes carrier multiplication due to impact ionization.

The inventors of the present invention note that impact ionization substantially occurs within an impact ionization region 118 within the deep nwell region 106 near or proximate to the emitter region 114. The impact ionization is largely a function of the dopant concentration within the impact ionization region 118. As a consequence, the inventors of the present invention note that the breakdown voltage is also a function of the dopant concentration within the impact ionization region 118. It is noted that reduced dopant concentration within only the impact ionization region 118 yields an increased breakdown voltage while mitigating impact on other operational characteristics, such as drive current, speed, and the like. Thus, controlling the dopant concentration within the impact ionization region 118 can be employed to tailor the breakdown voltage of the device 100 without substantially impairing other operational characteristics.

Aspects of the present invention employ a mask during formation of deep well regions that at least partially blocks dopant implantation within impact ionization regions. As a result, the dopant concentration within the impact ionization regions is reduced and breakdown voltages can be tailored.

Figure 3A:
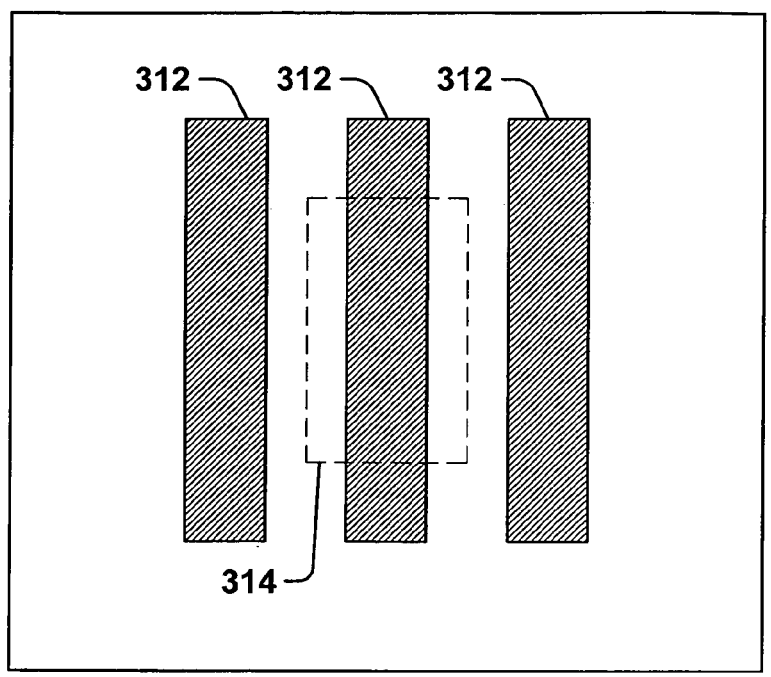
FIG. 3A is a top view of an intrinsic dilute mask in accordance with an aspect of the present invention.

FIG. 3A is a top view of an intrinsic dilute mask 310 in accordance with an aspect of the present invention. The intrinsic dilute is provided for illustrative purposes and is an example of a suitable mask that can be employed with aspects of the present invention. It is appreciated that other masks and/or variations of the mask 310 are contemplated and in accordance with the present invention.

The intrinsic dilute mask 310 is comprised of a suitable mask material. For example, the mask 310 can be comprised of a photoresist material formed via a spin-on or other type deposition process. Additionally, as another example, the mask 310 can comprise other masking layers, such as a dielectric layer and/or other material that serves as an implantation mask.

The intrinsic dilute mask 310 is formed and employed for forming deep well regions of bipolar transistors. The intrinsic dilute mask 310 is used for an ion implantation process that implants dopants into a semiconductor layer to form the deep well regions. The mask 310 includes rectangular blocking portions 312 that block passage of dopants there through. As a result, underlying portions of deep well regions below the blocking portions have a lower dopant concentration.

After implantation, a thermal process is typically employed that causes the implanted dopants to diffuse. As a result, a target region 314 is created that has a relatively low dopant concentration. The target region 314 typically corresponds to an impact ionization region. Thus, the relatively low dopant concentration within the target region 314 yields a higher breakdown voltage.

In one example, the intrinsic dilute mask 310 is formed by selecting the target region 314 of a deep well region of a bipolar transistor. A blocking percentage for the target region 314 is selected according to a selected breakdown voltage. Then, a blocking arrangement, in this example the rectangular blocking portions 312, is selected according to the blocking percentage. Then, the mask 310 is formed over/on the device and employed during deep well formation.

Figure 3B:
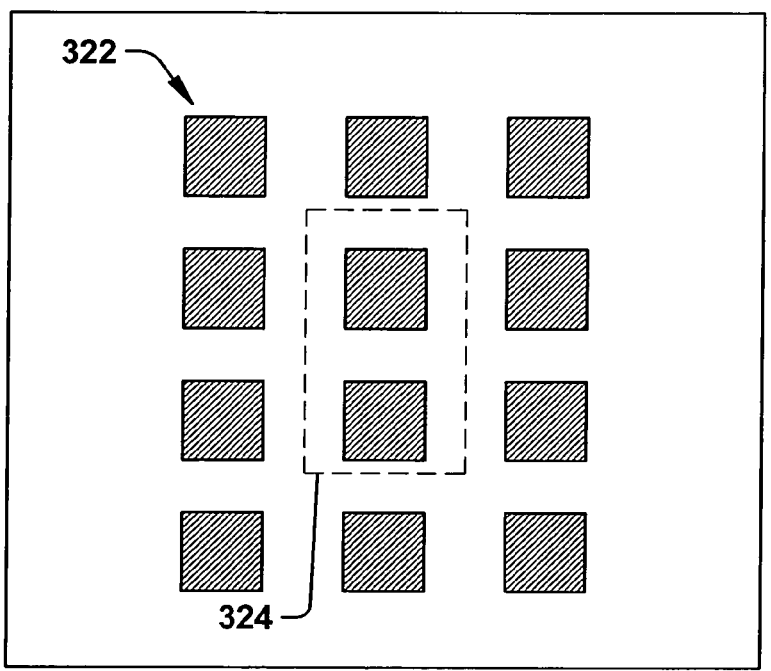
FIG. 3B is a top view of another intrinsic dilute mask in accordance with an aspect of the present invention.

FIG. 3B is a top view of another intrinsic dilute mask 320 in accordance with an aspect of the present invention. The intrinsic dilute is provided for illustrative purposes and is an example of a suitable mask that can be employed with aspects of the present invention. It is appreciated that other masks and/or variations of the mask 320 are contemplated and in accordance with the present invention.

The intrinsic dilute mask 320 is comprised of a suitable mask material and is formed and employed for forming deep well regions of bipolar transistors. The intrinsic dilute mask 320 is used for an ion implantation process that implants dopants into a semiconductor layer to form the deep well regions. The mask 320 includes a blocking grid 322 block passage of dopants therethrough. As a result, underlying portions of deep well regions below the blocking grid 322 have a lower dopant concentration.

In one example, the intrinsic dilute mask 320 is formed by selecting the target region 324 of a deep well region of a bipolar transistor. A blocking percentage for the target region 324 is selected according to a selected breakdown voltage. Then, a blocking arrangement, in this example the blocking grid 322, is selected according to the blocking percentage. Then, the mask 320 is formed over/on the device and employed during deep well formation.

After implantation, a thermal process is typically employed that causes the implanted dopants to diffuse. As a result, a target region 324 is created that has a relatively low dopant concentration. The target region 324 typically corresponds to an impact ionization region. Thus, the relatively low dopant concentration within the target region 324 yields a higher breakdown voltage.

Figure 4:
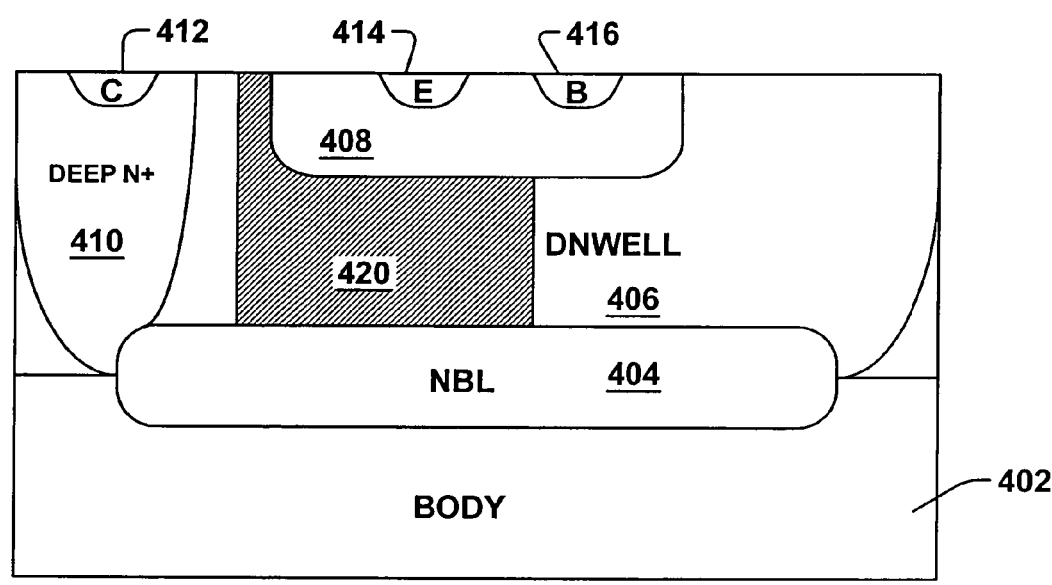
FIG. 4 is a cross sectional view of a bipolar transistor in accordance with an aspect of the present invention.

FIG. 4 is a cross sectional view of a bipolar transistor 400 in accordance with an aspect of the present invention. The transistor 400 is formed as part of a BiCMOS process and is provided for illustrative purposes. It is appreciated that suitable variations from the transistor are contemplated and in accordance with the present invention.

The bipolar device 400, in this example, is comprised of buried layer 404, n-type in this example, formed in a semiconductor body or substrate 402. A deep well 406 is formed on the n-type buried layer 404. Typically, the deep well 406 is formed by growing an epitaxial layer on/over the buried layer 404 and then implanting an n-type dopant, in this example, to form the deep well 406. A shallow well 408 is formed within the deep well 406 and a deep collector 410 is formed also formed within the deep nwell 406. The deep collector 410 is also n-type, in this example, and is in contact with the n-type buried layer 404. A collector region 412 is formed within the deep collector 410. An emitter region 414 and a base region 416 are formed within the shallow pwell 408. The deep collector region 410 is also referred to as an extrinsic portion of the deep nwell 406 whereas a remaining portion of the deep well 406 is referred to an intrinsic portion.

As stated previously, bipolar devices have a number of operational characteristics, such as breakdown voltage (collector-emitter), gain, collector drive current, speed, and the like. The operational characteristics are at least partly a function of the dopant concentrations and/or profiles the various regions of the device.

In particular, the breakdown voltage is strongly related to the dopant concentration within an impact ionization region wherein impact ionization occurs. The bipolar device 400 includes a dilute region 420 of the deep well region 406 that has a lower dopant concentration than other portions of the deep well region 406. The dilute region 420, in this example, substantially encompasses an impact ionization region and, as a result, increases the breakdown voltage for the bipolar device 400. Additionally, the breakdown voltage is increased without substantially altering other operational characteristics, such as gain, drive current, speed, and the like of the bipolar device 400. The dilute region 420, in this example, is formed by employing an intrinsic dilute mask, such as those shown in FIGS. 3A and 3B, during formation of the deep well region.

Although the device 400 is described and shown as an n-type bipolar device for illustrative purposes, it is noted that aspects of the present invention include p-type bipolar devices and is not limited to only n-type bipolar devices.

Figure 5:
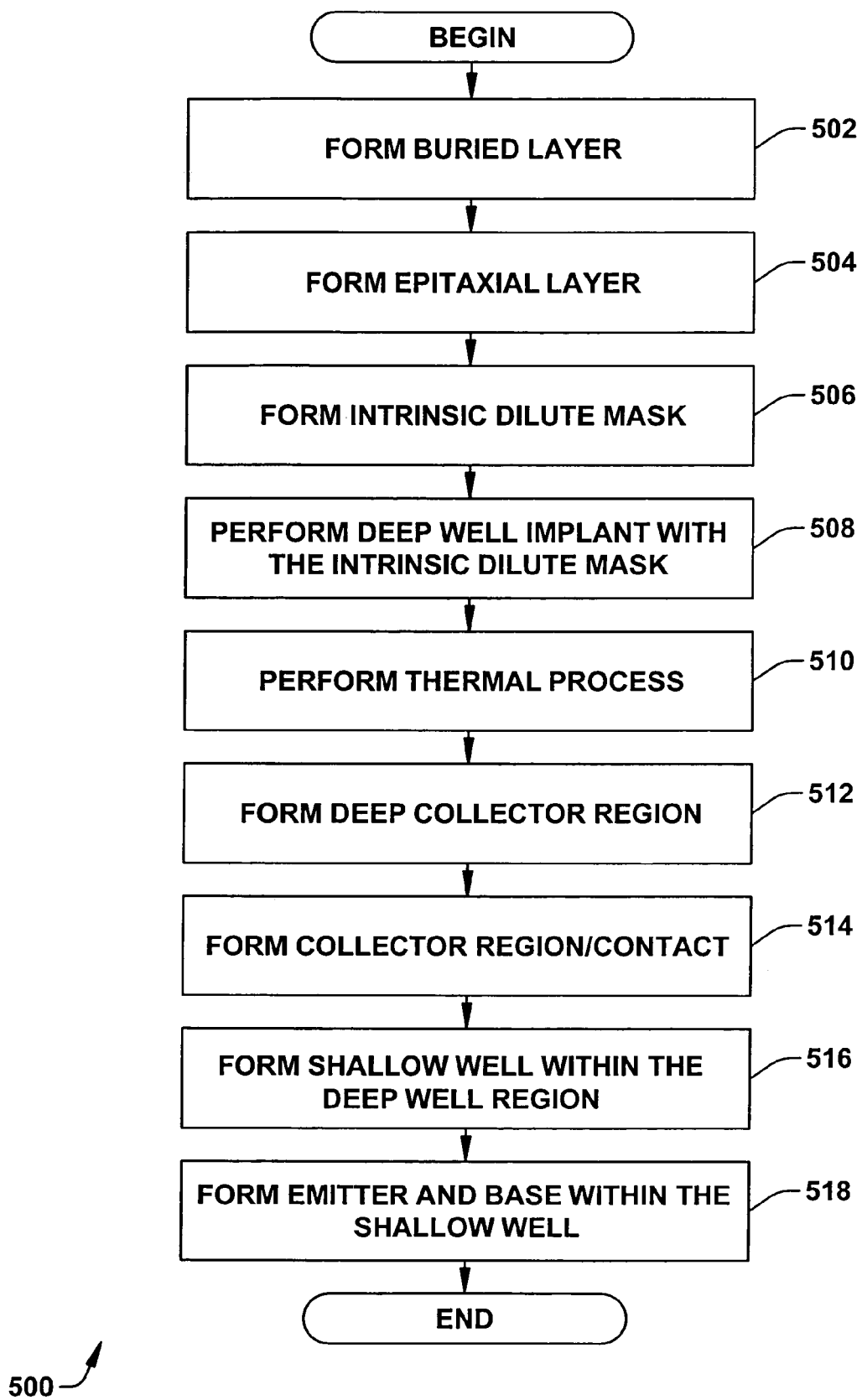
FIG. 5 is a flow diagram illustrating a method 500 of fabricating a bipolar transistor device within a BiCMOS process in accordance with an aspect of the present invention.

FIG. 5 is a flow diagram illustrating a method 500 of fabricating a bipolar transistor device within a BiCMOS process in accordance with an aspect of the present invention.

The method begins at block 502, wherein a buried layer is formed in a semiconductor substrate or body. The substrate or body can be lightly doped as p-type or n-type. The buried layer is formed by implanting a dopant, n-type (e.g., phosphor) or p-type (e.g., boron), with a selected dose and energy. A mask can be employed to form the buried layer within only selected portions of a device. A thermal process can be performed subsequent to implantation in order to diffuse the implanted dopants.

An epitaxial layer is formed on the buried layer at block 504. A suitable epitaxial growth process is employed to form the epitaxial layer to a selected thickness. An intrinsic dilute mask is then formed over the epitaxial layer that exposes target deep well regions and includes blocking portions about a target dilution region at block 506. The intrinsic dilute mask is comprised of a suitable masking material, such as photoresist. The blocking portions include, for example, grids or arrays of blocking elements, such as rectangles or squares.

A deep well implant employing the intrinsic dilute mask is performed at block 508 to form a deep well region having a dilute region at or about an expected impact ionization region. The implant is performed with an n-type or p-type dopant. The blocking portions of the intrinsic dilute mask reduce the amount of dopant implanted into the dilute region of the deep well region. As a result, the dopant concentration of the dilute region is less than other portions of the deep well region. Thus, a greater breakdown voltage is obtained without substantially altering other operational characteristics, such as gain, drive current, and the like. The dilute resist mask can also be removed by a suitable clean or ash process.

A thermal process is performed at block 510 that causes diffusion of implanted dopants within the deep well region. As a result, the dopant profile of the dilute region is more uniform.

A deep collector region is formed at block 512. The deep collector region is formed along an edge of the deep well region and in contact with the buried layer. A selective n-type or p-type dopant implant is performed to form the deep collector region. It is noted that the deep collector region can be formed before or after formation of the deep well region. A collector region is formed within the deep collector region by implanting a suitable dopant at block 514.

A shallow well is formed within the deep well region at block 516. The shallow well has opposite type conductivity to that of the deep well region. Emitter and base regions are formed within the shallow well at block 518. The emitter region is typically formed proximate to the dilute region of the deep well region. Subsequently, other fabrication processes, such as interlayer dielectric layers, metallization layers, and the like can be performed.

It is noted that although the method 500 is described in a particular order, portions of the method 500 can be performed in suitable orderings different than that described and illustrated above. Furthermore, it is appreciated that other portions of the detailed description can be referenced to facilitate in understanding and describing the method 500.

FIG. 6 is a graph 600 depicting dopant concentration throughout an intrinsic portion of a deep well region for a bipolar device formed in accordance with the present invention. The example bipolar device can be fabricated, for example, by the method 500 shown and described above. The graph 600 is provided as an example and to facilitate a better understanding of aspects of the invention and is not indicative of experimental results.

The graph 600 depicts lateral distance across an intrinsic portion of a deep well region along an x-axis and dopant concentration along a y-axis. A line 602 illustrates the dopant concentration according to the lateral distance. It can be seen that the dopant concentration is reduced within a dilute region 604 of the intrinsic region. The dilute region is formed by employing an intrinsic dilute mask during formation of the deep well region and is typically located about an impact ionization region proximate an emitter. The reduced dopant concentration yields a greater breakdown voltage without substantially impacting other operational characteristics.

As stated above, employing an intrinsic dilute mask can facilitate bipolar device fabrication within BiCMOS processes by increasing breakdown voltages without substantially altering other operational characteristics. However, the intrinsic dilute region can, for example, reduce drive current and speed, although the reduction is less than if the entire deep well region's dopant concentration is reduced. The inventors of the present invention note that increasing a dopant concentration at a portion of the intrinsic dilute region, in particular directly below the emitter, facilitates some operational characteristics, such as drive current and speed and yet still provides a suitable increase in breakdown voltage. This can also be referred to as selectively implanting for collector (SIC) to increase speed at higher driver current and prevent or mitigate base push out. Conventionally, a separate implant is required to increase the dopant concentration. However, the inventors of the present invention employ a varied intrinsic dilute mask to obtain the desired drive current and gain without employing additional process steps.

Figure 7A:
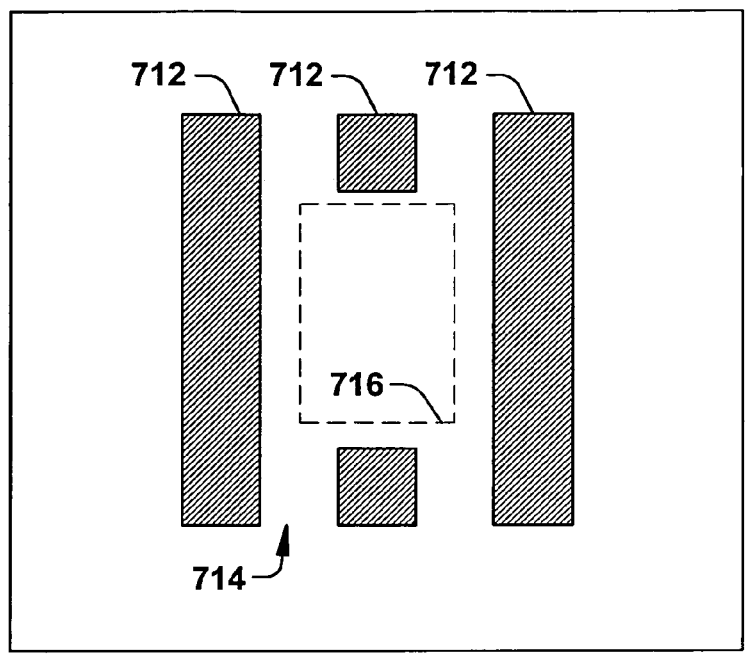
FIG. 7A is a top view of a varied intrinsic dilute mask for SIC in accordance with an aspect of the present invention.
Figure 7B:
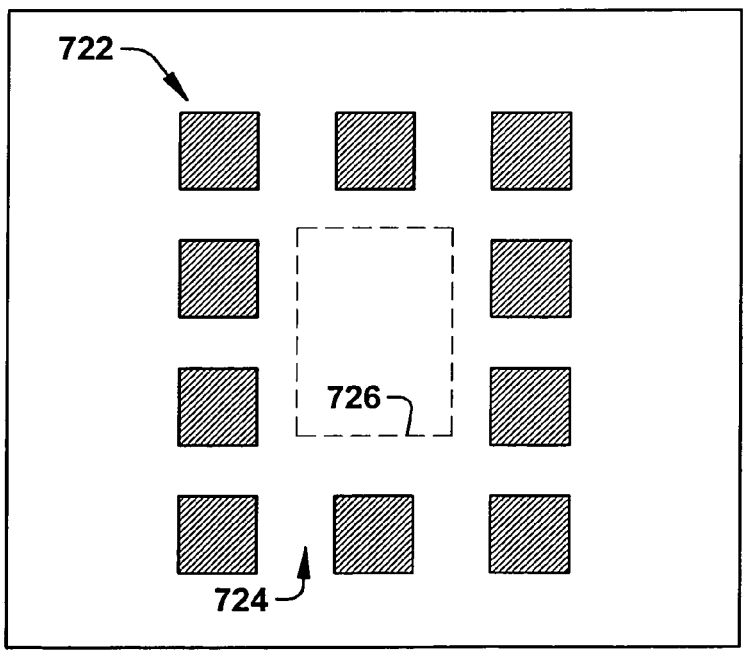
FIG. 7B is a top view of another varied intrinsic dilute mask for SIC in accordance with an aspect of the present invention.

FIGS. 7A and 7B are varied intrinsic dilute masks that can permit higher dopant concentrations below the emitter contact to yield bipolar transistor devices with increased breakdown voltages and also with relatively high drive current and/or speed.

FIG. 7A is a top view of a varied intrinsic dilute mask 710 for SIC in accordance with an aspect of the present invention. The varied intrinsic dilute mask is provided for illustrative purposes and is an example of a suitable mask that can be employed with aspects of the present invention. It is appreciated that other masks and/or variations of the mask 710 are contemplated and in accordance with the present invention.

The varied intrinsic dilute mask 710 is comprised of a suitable mask material. For example, the mask 710 can be comprised of a photoresist material formed via a spin-on or other type deposition process. Additionally, as another example, the mask 710 can comprise other masking layers, such as a dielectric layer and/or other material that serves as an implantation mask.

The varied intrinsic dilute mask 710 is formed and employed for forming deep well regions of bipolar transistors. The intrinsic dilute mask 710 is used for an ion implantation process that implants dopants into a semiconductor layer to form the deep well regions. The mask 710 includes rectangular blocking portions 712 that block passage of dopants therethrough. As a result, underlying portions of deep well regions below the blocking portions have a lower dopant concentration. However, the blocking portion 714 includes a non-blocking portion 716, in this example shown at about the center of the mask 710. The non-blocking portion does not block dopant implantation. In this example, the non-blocking portion 716 is shown as open, however aspects of the invention can include varied amounts of blocking for the portion 716. For example, the non-blocking portion 716 can include smaller rectangular shapes that block a smaller percentage of dopants during implantation than that of the blocking portion 714.

In one example, the varied intrinsic dilute mask 710 is formed by selecting the target region 714 and drive region 716 of a deep well region of a bipolar transistor. A blocking percentage for the target region 714 is selected according to a selected breakdown voltage. A blocking or non-blocking percentage for the drive region 716 is also selected. Then, a blocking arrangement, in this example the rectangular blocking portions 712, is selected according to the blocking percentage. Then, the mask 710 is formed over/on the device and employed during deep well formation.

After implantation, a thermal process is typically employed that causes the implanted dopants to diffuse. As a result, a target or intrinsic region 714 is created that has a relatively low dopant concentration with a drive region 716 that has a relatively high dopant concentration. The drive region 716 corresponds to the non-blocking portion of the mask 710. The target region 714 typically corresponds to an impact ionization region. Thus, the relatively low dopant concentration within the target region 714 yields a relatively higher breakdown voltage and the relatively high dopant concentration within the drive region 716 yields a selected drive current and/or speed.

FIG. 7B is a top view of another varied intrinsic dilute mask 720 for SIC in accordance with an aspect of the present invention. The intrinsic dilute mask 720 is provided for illustrative purposes and is an example of a suitable mask that can be employed with aspects of the present invention. It is appreciated that other masks and/or variations of the mask 720 are contemplated and in accordance with the present invention.

The varied intrinsic dilute mask 720 is comprised of a suitable mask material and is formed and employed for forming deep well regions of bipolar transistors. The intrinsic dilute mask 720 is used for an ion implantation process that implants dopants into a semiconductor layer to form the deep well regions. The mask 720 includes a blocking grid 722 block passage of dopants therethrough and a non-blocking portion 726 that permits passage of dopants. As a result, underlying portions 724 of deep well regions below the blocking grid 722 have a lower dopant concentration but underlying portions of the non-blocking portion 726 have a higher dopant concentration.

In one example, the varied intrinsic dilute mask 720 is formed by selecting the target region 724 and drive region 726 of a deep well region of a bipolar transistor. A blocking percentage for the target region 724 is selected according to a selected breakdown voltage. A blocking or non-blocking percentage for the drive region 726 is also selected. Then, a blocking arrangement, in this example the grid 722, is selected according to the blocking percentage. Then, the mask 720 is formed over/on the device and employed during deep well formation.

After implantation, a thermal process is typically employed that causes the implanted dopants to diffuse. As a result, a target/dilute region 724 of the bipolar device is created that has a relatively low dopant concentration and a drive region 726 is created that has a relatively high dopant concentration. The target region 724 typically corresponds to an impact ionization region. Thus, the relatively low dopant concentration within the target region 724 yields a higher breakdown voltage and the relatively high dopant concentration within the drive region 726 yields a selected drive current and/or speed.

Figure 8:
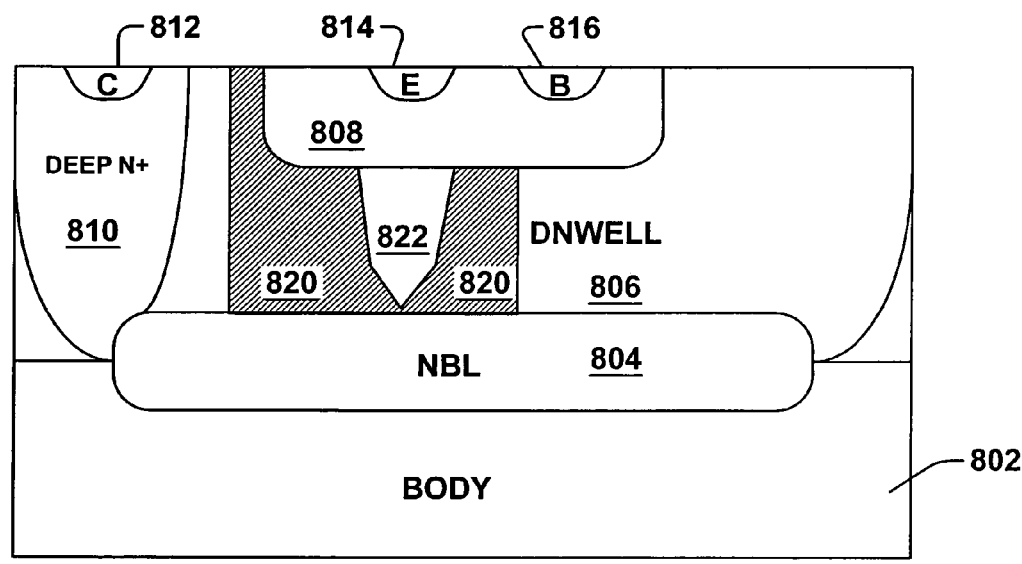
FIG. 8 is a cross sectional view of a bipolar transistor in accordance with an aspect of the present invention.

FIG. 8 is a cross sectional view of a bipolar transistor 800 in accordance with an aspect of the present invention. The transistor 800 is formed as part of a BiCMOS process and is provided for illustrative purposes. It is appreciated that suitable variations from the transistor are contemplated and in accordance with the present invention. The transistor device 800 has an intrinsic dilute region 820 that yields a relatively higher breakdown voltage and a drive region 822 that yields a relatively higher driver current.

The bipolar device 800, in this example, is comprised of buried layer 804, n-type in this example, formed in a semiconductor body or substrate 802. A deep well 806 is formed on the n-type buried layer 804. Typically, the deep well 806 is formed by growing an epitaxial layer on/over the buried layer 804 and then implanting an n-type dopant, in this example, to form the deep well 806. A shallow well 808 is formed within the deep well 806 and a deep collector 810 is also formed within the deep nwell 806. The deep collector 810 is also n-type, in this example, and is in contact with the n-type buried layer 804. A collector region 812 is formed within the deep collector 810. An emitter region 814 and a base region 816 are formed within the shallow pwell 808. The deep collector region 810 is also referred to as an extrinsic portion of the deep nwell 806 whereas a remaining portion of the deep well 806 is referred to an intrinsic portion.

As stated previously, bipolar devices have a number of operational characteristics, such as breakdown voltage (collector-emitter), gain, collector drive current, speed, and the like. The operational characteristics are at least partly a function of the dopant concentrations and/or profiles the various regions of the device.

In particular, the breakdown voltage is strongly related to the dopant concentration within an impact ionization region wherein impact ionization occurs however drive current is related to the dopant concentration of the drive region 822. The bipolar device 800 includes the dilute region 820 of the deep well region 806 that has a lower dopant concentration than other portions of the deep well region 806 and the drive region 822 that has a higher dopant concentration than the dilute region. The dilute region 820, in this example, substantially encompasses an impact ionization region and, as a result, increases the breakdown voltage for the bipolar device 800 whereas the drive region 822 facilitates drive current. The dilute region 820 and the drive region 822, in this example, are formed by employing an intrinsic dilute mask, such as those shown in FIGS. 7A and 7B, during formation of the deep well region.

Although the device 800 is described and shown as an n-type bipolar device for illustrative purposes, it is noted that aspects of the present invention include p-type bipolar devices and is not limited to only n-type bipolar devices.

Figure 9:
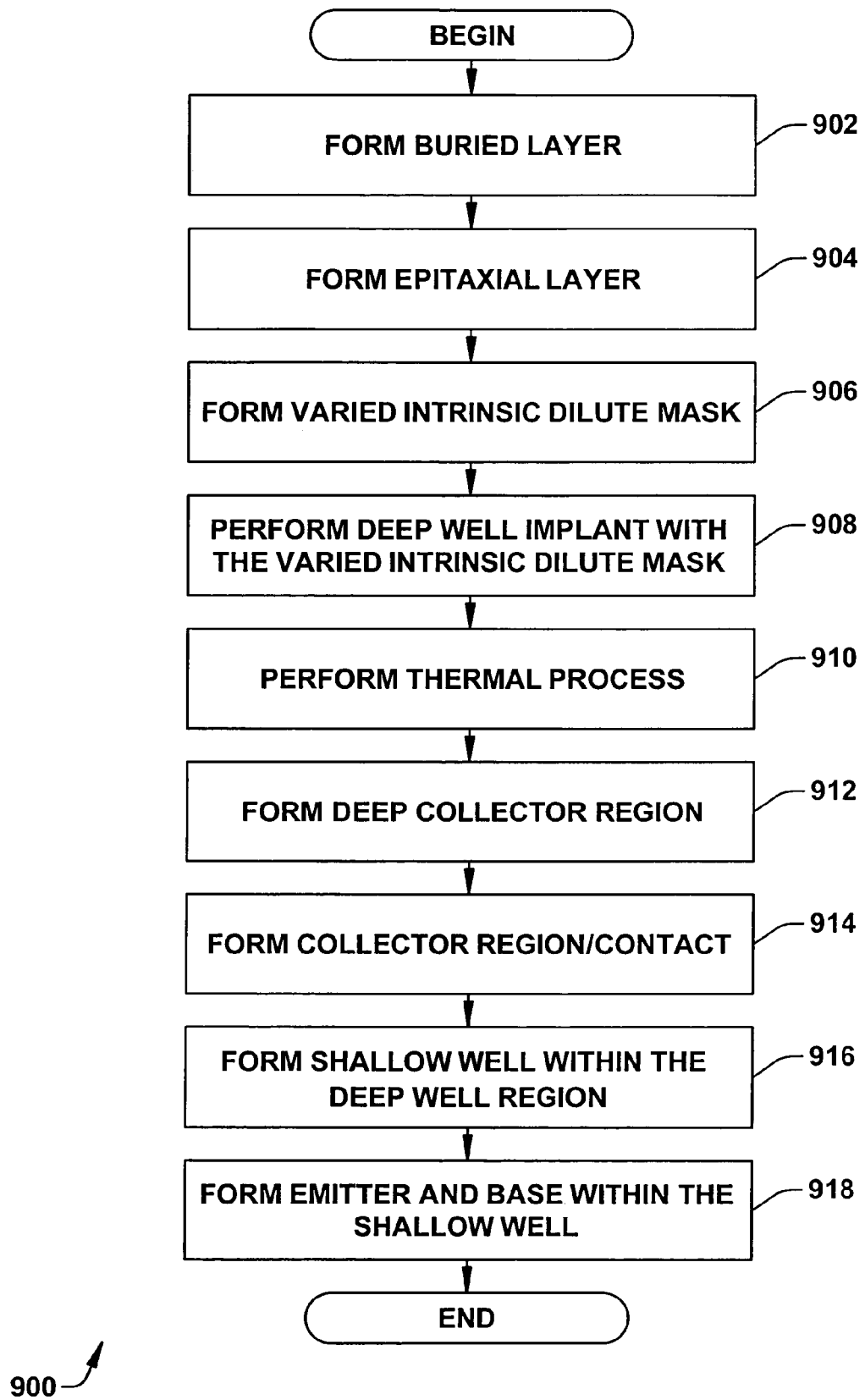
FIG. 9 is a flow diagram illustrating a method of fabricating a bipolar transistor device within a BiCMOS process in accordance with an aspect of the present invention.

FIG. 9 is a flow diagram illustrating a method 900 of fabricating a bipolar transistor device within a BiCMOS process in accordance with an aspect of the present invention. The device is formed with a dilute region and a drive region to tailor breakdown voltage and drive current, respectively.

The method begins at block 902, wherein a buried layer is formed in a semiconductor substrate or body. The substrate or body can be lightly doped as p-type or n-type. The buried layer is formed by implanting a dopant, n-type (e.g., phosphor) or p-type (e.g., boron), with a selected dose and energy. A mask can be employed to form the buried layer within only selected portions of a device. A thermal process can be performed subsequent to implantation in order to diffuse the implanted dopants.

An epitaxial layer is formed on the buried layer at block 904. A suitable epitaxial growth process is employed to form the epitaxial layer to a selected thickness. A varied intrinsic dilute mask is then formed over the epitaxial layer that exposes target deep well regions and includes blocking portions about a target dilution region and non-blocking portions about a target drive region at block 906. The varied intrinsic dilute mask is comprised of a suitable masking material, such as photoresist. The blocking portions include, for example, grids or arrays of blocking elements, such as rectangles, squares, and/or other suitable shapes.

A deep well implant employing the intrinsic dilute mask is performed at block 908 to form a deep well region having a dilute region at or about an expected impact ionization region and a drive region. The implant is performed with an n-type or p-type dopant. The blocking portions of the varied intrinsic dilute mask reduce the amount of dopant implanted into the dilute region of the deep well region. A non-blocking portion of the varied intrinsic dilute mask allows a higher amount of dopant to be implanted into the drive region. As a result, the dopant concentration of the dilute region is less than other portions of the deep well region and the dopant concentration of the drive region is higher than that of the dilute region. Thus, a greater breakdown voltage and drive current are obtained and can be tailored without substantially altering other operational characteristics. The varied dilute resist mask can also be removed by a suitable clean or ash process.

A thermal process is performed at block 910 that causes diffusion of implanted dopants within the deep well region. As a result, the dopant profile of the dilute region and the drive region is more uniform.

A deep collector region is formed at block 912. The deep collector region is formed along an edge of the deep well region and in contact with the buried layer. A selective n-type or p-type dopant implant is performed to form the deep collector region. A collector region is formed within the deep collector region by implanting a suitable dopant at block 914.

A shallow well is formed within the deep well region at block 916. The shallow well has opposite type conductivity to that of the deep well region. Emitter and base regions are formed within the shallow well at block 918. The emitter region is typically formed proximate to the dilute region of the deep well region. Subsequently, other fabrication processes, such as interlayer dielectric layers, metallization layers, and the like can be performed.

It is noted that although the method 900 is described in a particular order for illustrative purposes, however portions of the method 900 can be performed in suitable orderings different than that described and illustrated above. Furthermore, it is appreciated that other portions of the detailed description can be referenced to facilitate in understanding and describing the method 900.

Figure 10:
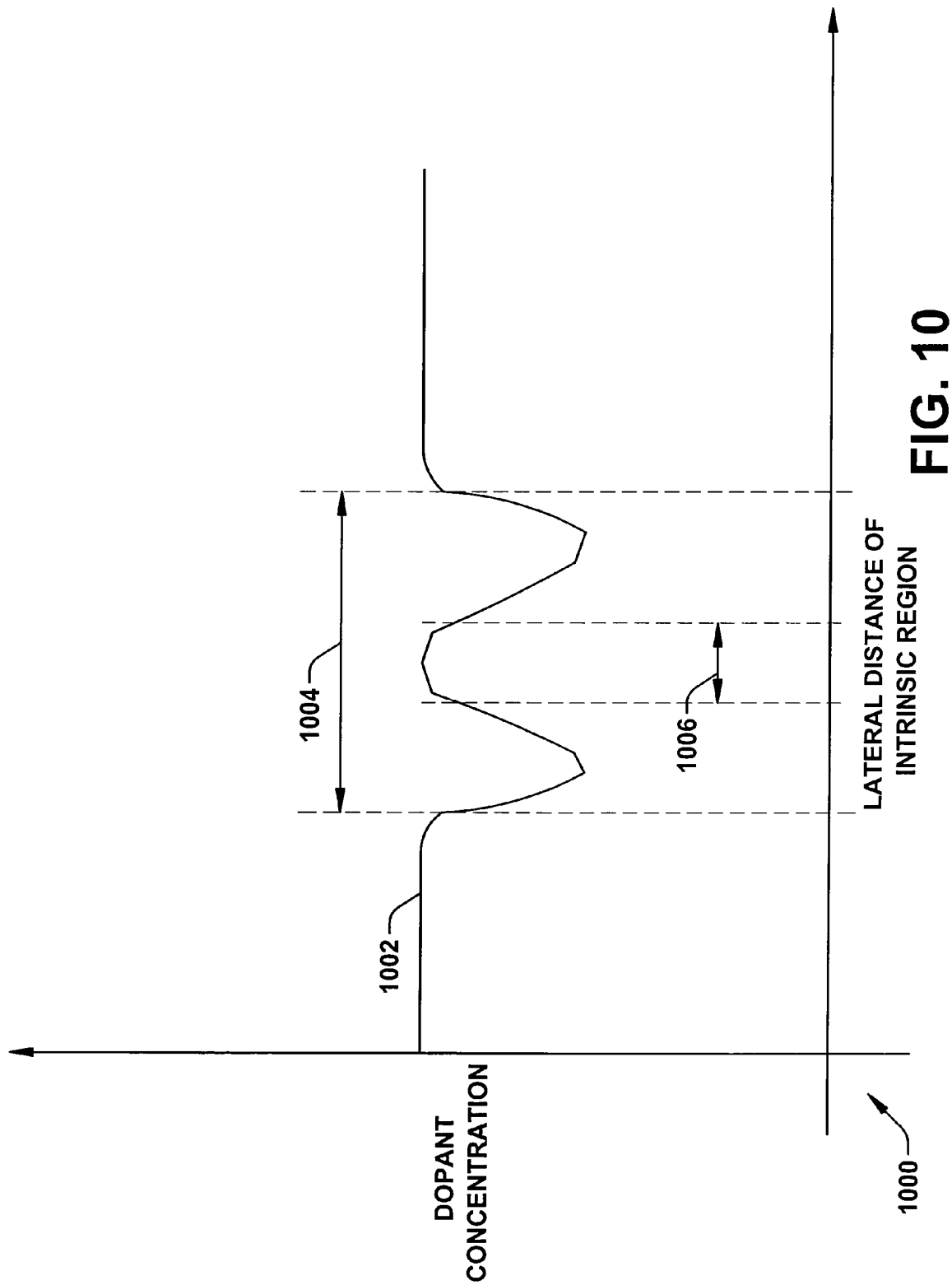
FIG. 10 is a graph depicting dopant concentration throughout an intrinsic portion of a deep well region for a bipolar device formed in accordance with the present invention.

FIG. 10 is a graph 1000 depicting dopant concentration throughout an intrinsic portion of a deep well region for a bipolar device formed in accordance with the present invention. The example bipolar device can be fabricated, for example, by the method 900 shown and described above and includes a dilute region and a drive region. The graph 1000 is provided as an example and to facilitate a better understanding of aspects of the invention and is not indicative of experimental results.

The graph 1000 depicts lateral distance across an intrinsic portion of a deep well region along an x-axis and dopant concentration along a y-axis. A line 1002 illustrates the dopant concentration according to the lateral distance. It can be seen that the dopant concentration is reduced within a dilute region 1004 of the intrinsic region. However, a drive region 1006 located within or in between the intrinsic region has a higher dopant concentration. The dilute region and the drive region are formed by employing a varied intrinsic dilute mask during formation of the deep well region. The dilute region is typically located about an impact ionization region proximate an emitter. The reduced dopant concentration of the dilute region yields a greater breakdown voltage whereas the increased dopant concentration of the drive region yields a greater drive current.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of forming a bipolar transistor in a BiCMOS process, the method comprising:
   forming a buried layer of a first conductivity type in a semiconductor body;
   forming an intrinsic dilute mask over the semiconductor body that covers at least a portion of a selected region of a target deep well region; and
   implanting a dopant of the first conductivity type within the target deep well region to form a deep well region within the semiconductor body, wherein the intrinsic dilute mask mitigates implantation within the selected region.

2. The method of claim 1, further comprising performing a thermal process that diffuses the dopant within the deep well region.

3. The method of claim 2, further comprising forming a shallow well region of a second conductivity type within the deep well region.

4. The method of claim 3, further comprising forming a deep collector region of the first conductivity type, the deep collector region extending down and coupling to a portion of the buried layer.

5. The method of claim 4, further comprising forming a collector region of the first conductivity type within the deep collector region and forming a base region of the first conductivity type and an emitter region of the first conductivity type within the shallow well region.

6. The method of claim 5, wherein the emitter region is formed proximate to the selected region.

7. The method of claim 1, wherein the selected region is an impact ionization region.

8. The method of claim 1, wherein forming the intrinsic dilute mask comprises forming a blocking portion comprised of a grid of squares.

9. The method of claim 1, wherein forming the intrinsic dilute mask comprises forming a blocking portion comprised of rectangular regions.

10. The method of claim 1, wherein forming the intrinsic dilute mask comprises forming a blocking portion and a non-blocking portion within the blocking portion.

11. The method of claim 10, further comprising selecting a size and shape of the blocking portion according to a selected breakdown voltage.

12. The method of claim 10, further comprising selecting a size and shape of the non-blocking portion according to a selected drive current.

13. The method of claim 1, wherein the first conductivity type is p-type.

14. The method of claim 1, wherein the first conductivity type is n-type.

15. A method of forming a bipolar transistor in a BiCMOS process, the method comprising:
   forming a buried layer of a first conductivity type in a semiconductor body;
   forming a varied intrinsic dilute mask over the buried layer, wherein the varied intrinsic dilute mask comprises a blocking portion and a non-blocking portion within the blocking portion; and
   implanting a dopant of the first conductivity type forming a deep well region within the semiconductor body, wherein the deep well region comprises a dilute region corresponding to the blocking portion and a drive region corresponding to the non-blocking portion.

16. The method of claim 15, further comprising forming an epitaxial layer over the buried layer prior to forming the varied intrinsic dilute mask.

17. The method of claim 15, further comprising selecting the blocking portion according to a selected breakdown voltage.

18. The method of claim 15, further comprising selecting the non-blocking portion according to a selected drive current and operating speed.

19. The method of claim 15, further comprising:
   performing a thermal process after forming the deep well region;
   forming a shallow well region of a second conductivity type within the deep well region;
   forming a deep collector region of the first conductivity type, the deep collector region extending down and coupling to a portion of the buried layer; and
   forming a collector region of the first conductivity type within the deep collector region and forming a base region of the first conductivity type and an emitter region of the first conductivity type within the shallow well region.

20. The method of claim 19, wherein the dilute region has a dopant concentration corresponding to a selected breakdown voltage and the drive region has a dopant concentration corresponding to a selected drive current.

21. A method of employing an intrinsic dilute mask, the method comprising;
   selecting a target dilute region for a deep well region of a bipolar transistor;
   selecting a blocking percentage for the target dilute region according to a selected breakdown voltage;
   selecting a blocking arrangement for the target dilute region according to the selected blocking percentage; and
   forming the intrinsic dilute mask over the deep well region wherein the blocking arrangement is positioned over the target dilute region.

22. The method of claim 21, further comprising forming the deep well region by implanting a selected dopant and employing the intrinsic dilute mask.

23. The method of claim 21, further comprising selecting a drive region for the deep well region.

24. The method of claim 23, further comprising selecting a non-blocking percentage for the drive region according to a selected drive current.

* * * * *